(12) United States Patent
Timbol et al.

(10) Patent No.: US 11,876,065 B2
(45) Date of Patent: Jan. 16, 2024

(54) FLIP CHIP PACKAGE ASSEMBLY

(71) Applicant: Texas Instruments Incorporated, Dallas, TX (US)

(72) Inventors: Katleen Fajardo Timbol, Tarlac (PH); Salvatore Frank Pavone, Murphy, TX (US); Rafael Jose Lizares Guevara, Manila (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 23 days.

(21) Appl. No.: 17/491,496

(22) Filed: Sep. 30, 2021

(65) Prior Publication Data
US 2023/0104156 A1   Apr. 6, 2023

(51) Int. Cl.
*H01L 23/00* (2006.01)
*H01L 21/027* (2006.01)

(52) U.S. Cl.
CPC ............ *H01L 24/13* (2013.01); *H01L 21/027* (2013.01); *H01L 24/04* (2013.01); *H01L 24/11* (2013.01); *H01L 2221/1068* (2013.01); *H01L 2224/022* (2013.01); *H01L 2224/0401* (2013.01); *H01L 2224/1146* (2013.01); *H01L 2224/1147* (2013.01); *H01L 2224/13144* (2013.01); *H01L 2224/13147* (2013.01); *H01L 2924/014* (2013.01); *H01L 2924/177* (2013.01)

(58) Field of Classification Search
CPC ....... H01L 24/13; H01L 21/027; H01L 24/04; H01L 24/11; H01L 2221/1068; H01L 2224/022; H01L 2224/0401; H01L 2224/1146; H01L 2224/1147; H01L 2224/13144; H01L 2224/13147; H01L 2924/014; H01L 2924/177
See application file for complete search history.

(56) References Cited

U.S. PATENT DOCUMENTS

| 2011/0266667 | A1* | 11/2011 | Wu ......................... H01L 24/11 257/E23.079 |
| 2015/0048498 | A1* | 2/2015 | Yang ....................... H01L 24/05 257/737 |
| 2015/0200166 | A1* | 7/2015 | Kono ..................... H01L 23/562 257/529 |
| 2017/0012012 | A1* | 1/2017 | Camenforte, III .. H01L 21/4853 |
| 2020/0303333 | A1* | 9/2020 | Chiu .................... H01L 21/4832 |
| 2021/0134750 | A1 | 5/2021 | Manack et al. |

* cited by examiner

*Primary Examiner* — Douglas W Owens
(74) *Attorney, Agent, or Firm* — Dawn Jos; Frank D. Cimino

(57) ABSTRACT

In a described example, an apparatus includes: a semiconductor die having a device side surface; bond pads on the semiconductor die on the device side surface; post connects having a proximate end on the bond pads and extending from the bond pads to a distal end, the diameter of the post connects at the proximate end being the same as the diameter of the post connects at the distal end; polyimide material covering sides of the post connects and covering at least a portion of the bond pads; and solder bumps on the distal end of the post connects.

17 Claims, 10 Drawing Sheets

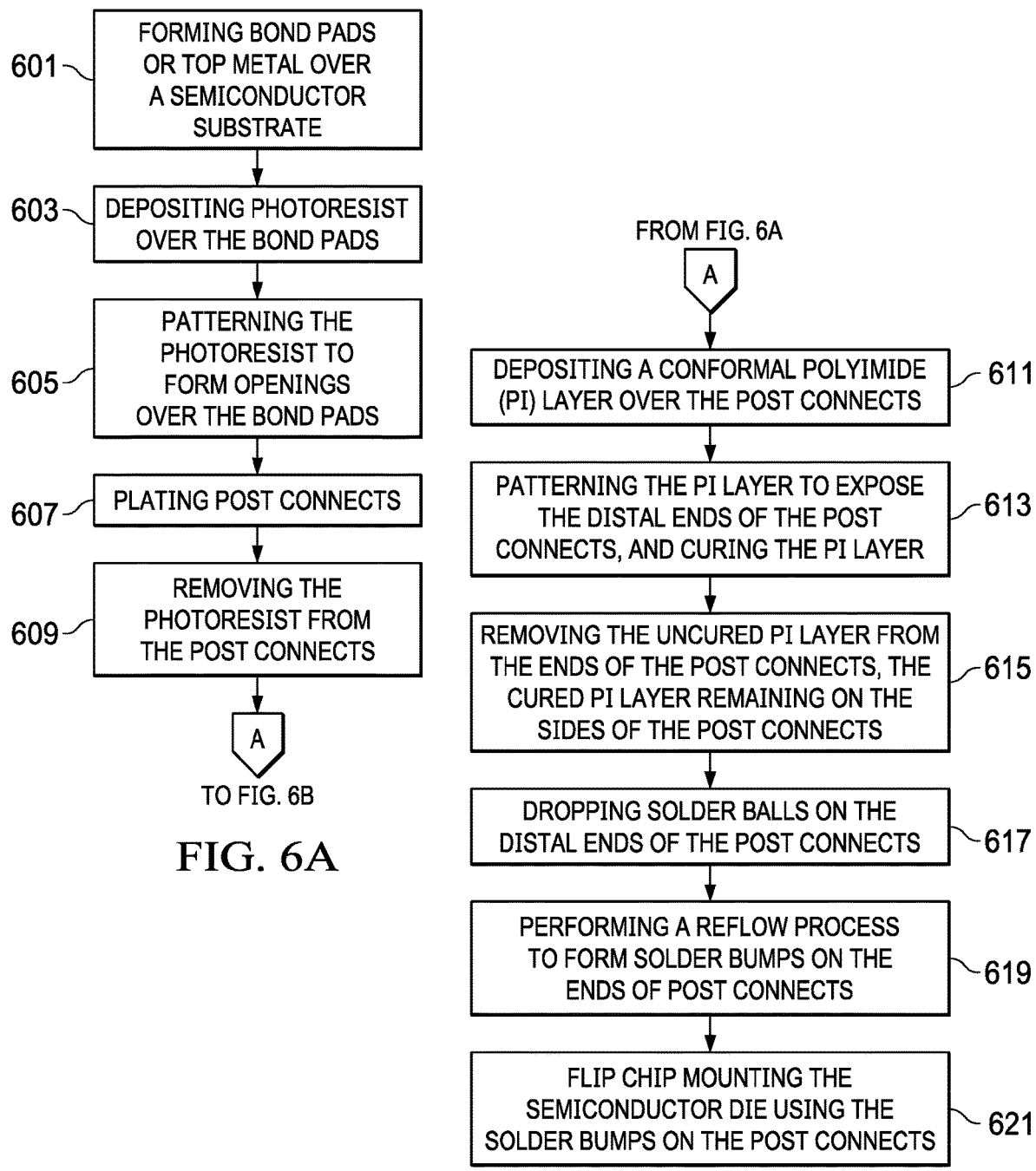

US 11,876,065 B2

FLIP CHIP PACKAGE ASSEMBLY

TECHNICAL FIELD

This relates generally to packaging electronic devices, and more particularly to assembling flip chip packaged semiconductor devices.

BACKGROUND

Processes for producing packaged semiconductor devices include mounting the electronic devices to a package substrate, and then covering the electronic devices with a mold compound in a molding process to form packages. When devices are mounted on package substrates in flip chip packages, a semiconductor die has post connects that extend from a proximal end placed on bond pads on a device side surface of the semiconductor die to a distal end having a solder ball or solder bump. In a flip chip package, the semiconductor die is mounted with the device side surface facing a package substrate. When the semiconductor die is flip chip mounted to the package substrate, the solder bumps at the distal end of the post connects are subjected to a thermal reflow process so that the solder melts and flows to form solder joints. The solder joints mechanically attach and electrically couple the semiconductor die to the package substrate. The solder joints attach the conductive post connects to conductive areas on the package substrate.

As the size and number of connections increase, and as semiconductor dies decrease in size, the pitch distance between the conductive post connects decreases. In some example flip chip packaging processes, voids occur in solder joints when the semiconductor die is mounted to the package substrate by solder reflow. These voids can occur due to solder shrinkage when the solder is partially converted to an intermetallic compound (IMC) at the metal-solder interface, and in part due to the concave or dished shape of the distal end of the post connects. Voids in the solder joint lead to reduced electrical performance, higher resistance in current paths between the semiconductor die and the package substrate, and even failures or scrapping of devices during testing. A flip chip package assembly method with reliable solder joints is needed.

SUMMARY

In a described example, a method of manufacturing a semiconductor package includes: forming bond pads over a device side surface of a semiconductor die; depositing a photoresist over the bond pads; patterning the photoresist to form openings over the bond pads; performing a plating process to form post connects in the openings, the post connects having proximate ends on the bond pads, and extending away from the bond pad to distal ends; removing the photoresist from the post connects and the bond pads; subsequently, depositing a polyimide (PI) layer over the post connects and the bond pads; patterning the PI layer and curing the PI layer; removing a portion of the PI layer to expose the distal ends of the post connects, the PI layer remaining on the sides of the post connects; and forming solder bumps on the distal ends of the post connects.

Another example includes an apparatus, having: a semiconductor die having a device side surface; bond pads on the semiconductor die on the device side surface; post connects having a proximate end on the bond pads and extending from the bond pads to a distal end, the diameter of the post connects at the proximate end being the same as the diameter of the post connects at the distal end; polyimide material covering sides of the post connects and covering at least a portion of the bond pads; and solder bumps on the distal end of the post connects.\

Yet another example includes a packaged semiconductor device, comprising: a semiconductor die having bond pads on a device side surface; post connects formed on the bond pads, the post connects having a proximate end on the bond pads and extending from the bond pads to a distal end; polyimide material covering sides of the post connects and at least a portion of the bond pads; a solder joint formed between the distal ends of the post connects and a package substrate, the device side surface of the semiconductor die facing the package substrate; and mold compound covering the semiconductor die, the post connects, and a portion of the package substrate to form a packaged semiconductor device.

BRIEF DESCRIPTION OF THE DRAWINGS

FIGS. 6A-6B illustrate in flow diagrams steps of method arrangements.

DETAILED DESCRIPTION

Figure 1:
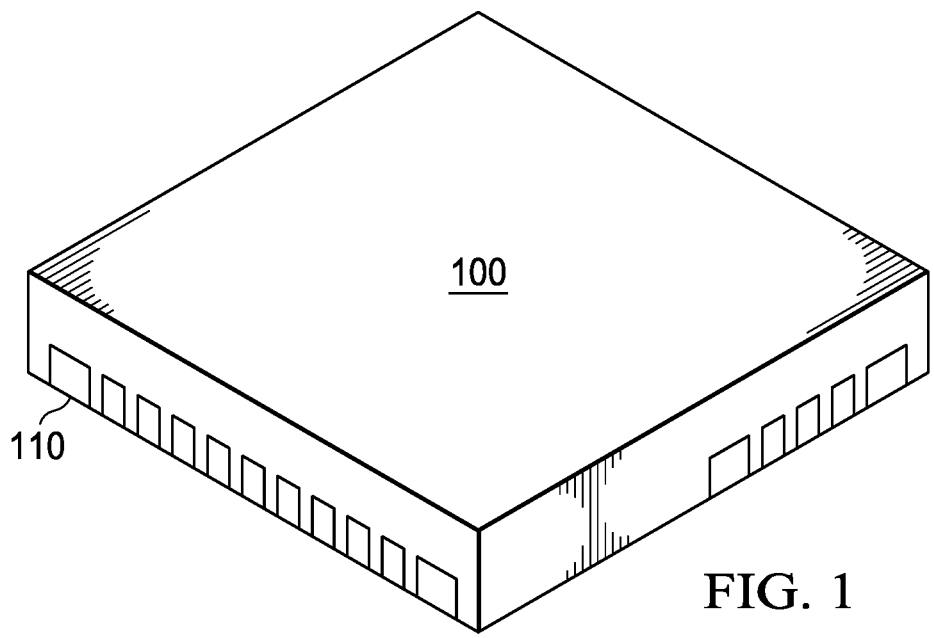
FIG. 1 is a projection view of a flip chip packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD). The semiconductor die includes a semiconductor substrate that has a device side surface and an opposite backside surface. Semiconductor processes form devices on the device side surface of the semiconductor die.

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be flip chip mounted with the device side surface facing a package substrate surface, and the semiconductor die mounted to the leads of the package substrate by conductive post connects attached to the package substrate by solder such as solder balls or bumps. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. For flip chip packages, a portion of the leads are configured to receive solder joints between the leads and the conductive post connects for the semiconductor die. The solder joints form the physical die attach and the electrical connection to the package substrate. When lead frames are used as package substrates, the lead frames can be provided in strips or arrays. Dies can be placed on the strips or arrays, the dies flip chip mounted to the lead frames and the lead frames and dies then covered with mold compound in a molding process.

Alternative package substrates include pre-molded lead frames (PMLF) and molded interconnect substrates (MIS) for receiving semiconductor dies. Routable lead frames, which include multiple levels of conductors in dielectric material, can be used. These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrates can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as flame retardant 4 (FR4) can be used as the package substrates.

The term "post connect" is used herein. As used herein, a post connect is a structure made of a conductive material, for example copper or copper alloys, gold or gold alloys, or combinations of conductive metal that provides a connection between a semiconductor die and a package substrate. A proximal end of the post connects is mounted to a bond pad on the device side surface of a semiconductor die, while a distal end of the post connect is extended away from the bond pad of the semiconductor die. When the packaged semiconductor device is oriented with the semiconductor die positioned above and facing a die mount surface of a package substrate in a flip chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and has a distal end facing away from the surface of the bond pad on the semiconductor die, where a proximal end of the post connect is mounted to the bond pad. Some post connects have a "dished" feature. Dishing at the distal ends of plated post connects is observed due to aspects of the plating processes used to form the post connects. A "dished" feature is a recessed or slightly concave area in a center portion of the distal end of a plated post connect. In the arrangements, the distal ends of the post connects are advantageously convex, or flat, and do not exhibit the dished features. In the arrangements, methods are disclosed that result in post connects with convex and flat distal ends. In the arrangements, the solder on the distal end of the post advantageously joins with a package substrate with reduced solder voids or without solder voiding, resulting in improved performance and improved reliability.

A package substrate, such as a lead frame, MIS, or PMLF substrate, has conductive portions on a planar die side surface. Leads of a metal lead frame are conductive all along the surfaces, while for other substrate types, conductive lands in dielectric substrate material are arranged and aligned to electrically and mechanically connect to the conductive post connects. The post connects can extend along the same direction as a conductive lead in the package substrate, so that the post connect appears as a rail or has a rectangular cross section. When the post connect is copper and is pillar shaped and has solder bumped at the end, it may be referred to as a "copper pillar bump." A copper pillar bump or copper bump is therefore an example of a post connect. In addition to the pillar shape, the post connect can also be a column, rectangle or rail shape, and can have an oval, round, square or rectangular cross section. In examples, multiple post connects can be arranged in parallel to one another with additional post connects coupled to a common trace on a package substrate, to provide a low resistance path between the semiconductor die and the package substrate. The post connects can also transfer thermal energy away from the semiconductor die to a package substrate and out of the package. A thermal reflow process is used to melt solder between the post connect and the package substrate to make a solder joint. The solder joint provides both a mechanical attachment and an electrical connection between the semiconductor die and the package substrate. Post connects are used to form several, tens, hundreds or thousands of connections between a semiconductor die and a package substrate in fine pitch semiconductor packages. In a discrete device or power transistor package, only a few post connects may be used. The conductive post connects can be, in some examples, a uniform size and have uniform or minimum pitch between them. In other examples, the size of the post connects can be made larger for power terminals or for high current signals, and smaller for control signals or logic signals that require less current, and may have varying spacing distances. Multiple post connects can be coupled in parallel to reduce resistance for certain signals, such as a high current signal, power or ground signal. Post connects can vary in size and shape, but in examples range from 10-70 microns in diameter, and may range from 20-50 microns in height extending away from the bond pad surface on the semiconductor die. As device sizes continue to fall and the density of connections rises, these sizes may decrease. Spacing between post connects may also decrease.

In packaging semiconductor devices, a mold compound may be used to partially cover a package substrate, to cover the semiconductor die, and to cover the connections from the semiconductor die to the package substrate. This "encapsulation" process is often an injection molding process, where thermoset mold compound such as epoxy resin can be used. A room temperature solid or powder mold compound can be heated to a liquid state and then molding can be performed. Transfer molding can be used. Unit molds shaped to surround an individual device may be used, or block molding may be used, to form the packages simultaneously for several devices using molten mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

In flip chip die attach processes, solder balls, solder columns, or solder bumps are used to form solder joints between the conductive post connects and a conductive lead or land on a package substrate. The post connects are formed extending from bond pads of the semiconductor die. The semiconductor die is then oriented with the distal ends of the post connects facing a die mounting surface of a circuit board or package substrate. A solder reflow process is used to attach the post connects to conductive die pads or leads on the package substrate, the solder joints forming a physical attachment and an electrical connection between the package substrate and the semiconductor die.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A small outline package or SOP can be used with the arrangements.

In the arrangements, a semiconductor die has post connects mounted with a proximate end on bond pads on a device side surface of the semiconductor die, and having solder balls on a distal end of the post connects. Methods are disclosed for forming plated post connects with convex or flat surfaces at the distal end. Solder is formed on the distal ends of the post connects. When the semiconductor die is flip chip mounted to a package substrate by a solder reflow process, the solder joints formed have reduced voids or are formed without voids, when compared to plated post connects formed without the use of the arrangements. The packaged semiconductor devices formed with the arrangements have increased reliability and increased performance. The methods disclose use fewer sputter and etch steps than methods used without the arrangements, and thus the costs for forming the plated post connects is reduced. The methods and materials used in the arrangements do not require changes or retooling of any tools, and no additional materials are used, so the arrangements can be easily implemented.

FIG. 1 illustrates a packaged electronic device 100 in a quad flat no lead (QFN) package. The packaged electronic device can have a body formed from a thermoset mold compound, such as epoxy resin. Other mold compounds, such as resins, epoxies, or plastics can be used. Leads 110 are part of a package substrate that supports a semiconductor die (not visible in FIG. 1, as it is obscured by the package body) within the package, the leads 110 are exposed from the mold compound and form electrical terminals for the packaged electronic device. The packaged electronic device 100 can be mounted to a circuit board using surface mount technology (SMT). Package sizes for packaged electronic devices are continually decreasing, and currently can be several millimeters on a side to less than one millimeter on a side, although larger and smaller sizes are also used. Future package sizes may be smaller. The number of terminals 110 is increasing with additional integration of circuitry on semiconductor dies.

Figure 2B:
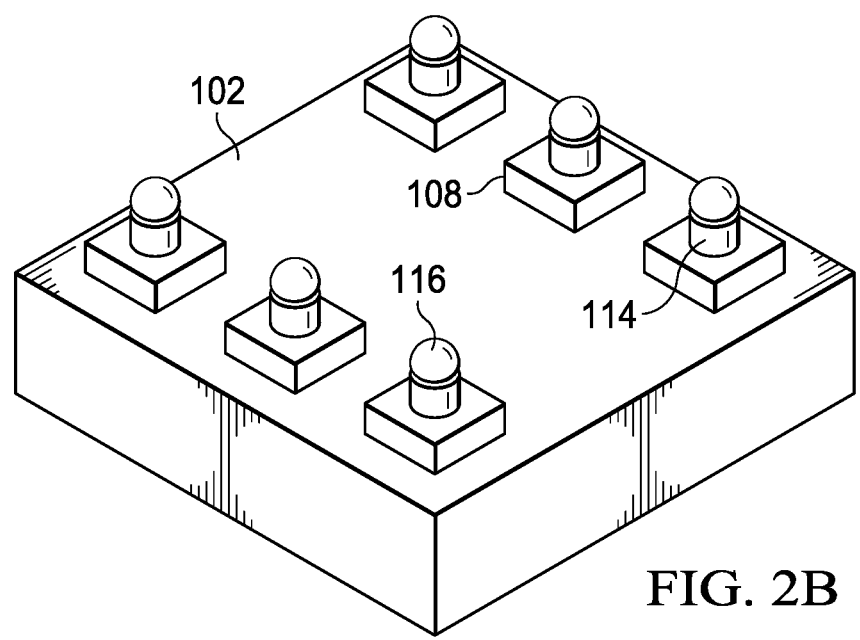
FIGS. 2A-2F illustrate in projection views and cross-sectional views major steps in manufacturing a flip chip packaged electronic device.
Figure 2A:
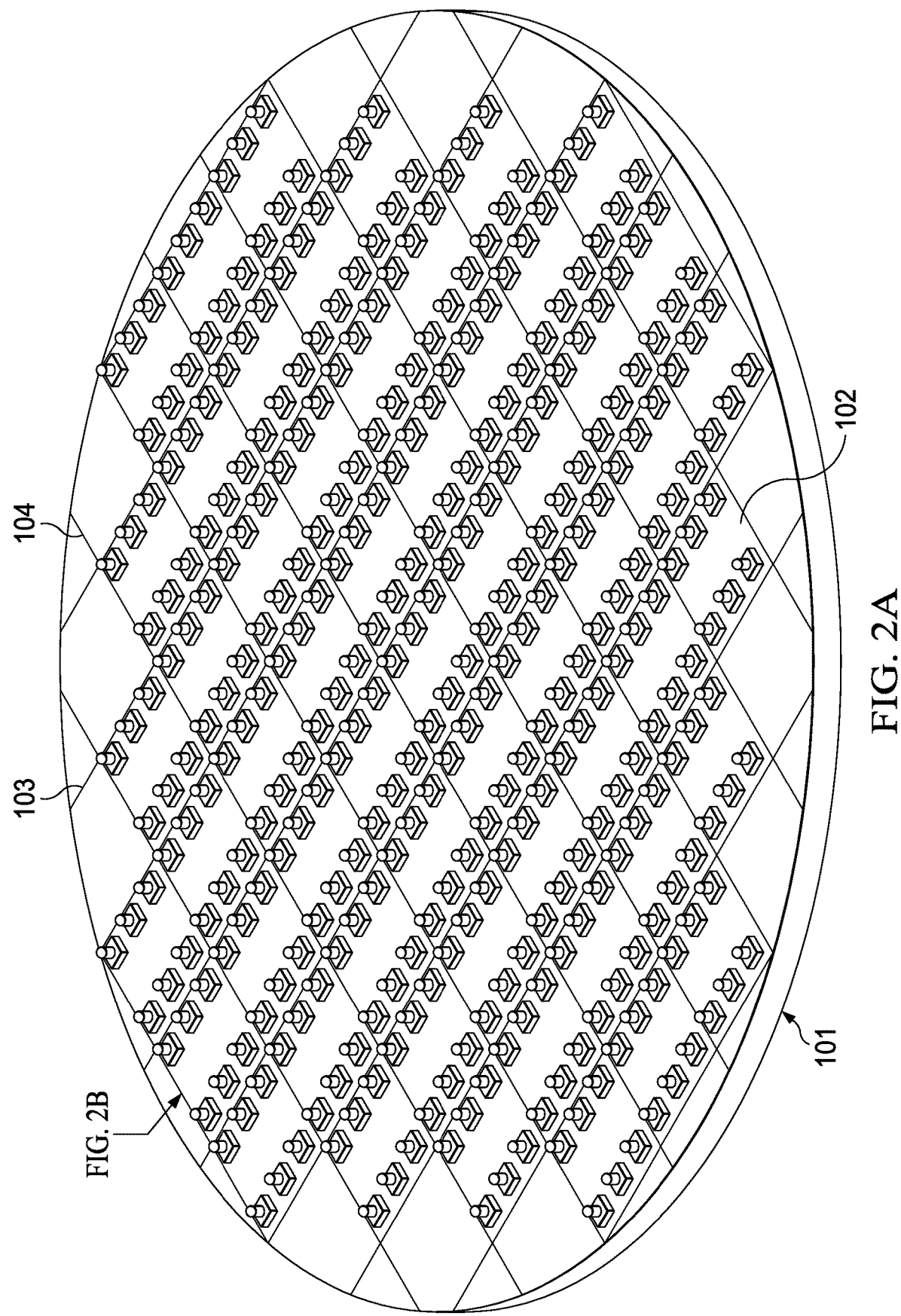

FIGS. 2A-2F illustrate in a series of steps a method for forming flip chip packaged electronic devices using solder bumps on post connects. In FIG. 2A, a semiconductor wafer 101 is shown with an array of semiconductor dies 102 in rows and columns formed on an active surface. The semiconductor dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. Vertical and horizontal (as the wafer is oriented in FIG. 2A) scribe lanes 103 and 104, which are perpendicular to one another and which run in parallel groups across the wafer, separate the rows and columns of the completed semiconductor dies, and provide areas for dicing the wafer to separate the semiconductor dies 102 from one another.

FIG. 2B illustrates a single semiconductor die 102, with bond pads 108, which are conductive pads that are electrically coupled to devices formed in the semiconductor die 102. Conductive post connects 114 are shown extending away from a proximate end mounted on the bond pads 108 on the active surface of semiconductor die 102, and solder bumps 116 are formed on the distal ends of the conductive post connects 114. The conductive post connects can be formed by electroless or electroplating. In an example, the conductive post connects are copper pillar bumps. Copper pillar bumps can be formed by sputtering a seed layer over the surface of the semiconductor wafer 101, forming a photoresist layer over the seed layer, using photolithography to expose the bond pads 108 in openings in the layer of photoresist, plating the copper conducive post connects 114 on the bond pads, and plating a lead solder or a lead-free solder such as an tin, silver (SnAg) or tin, silver, copper (SnAgCu) ("SAC") solder to form solder bumps 116 on the copper conductive post connects 114. Other conductive materials can be used for the conductive post connects in an electroplating or electroless plating operation, including silver, nickel, palladium, or tin, for example. Not shown for clarity of illustration are under bump metallization (UBM) which can be formed over the bond pads to improve plating and adhesion between the conductive post connects and the bond pads 108. After the plating operations, the photoresist is then stripped, and the excess seed layer is etched from the surface of the wafer. The semiconductor dies are then separated by dicing, or are singulated, using the scribe lanes 103, 104 (see FIG. 2A).

Figure 2C:
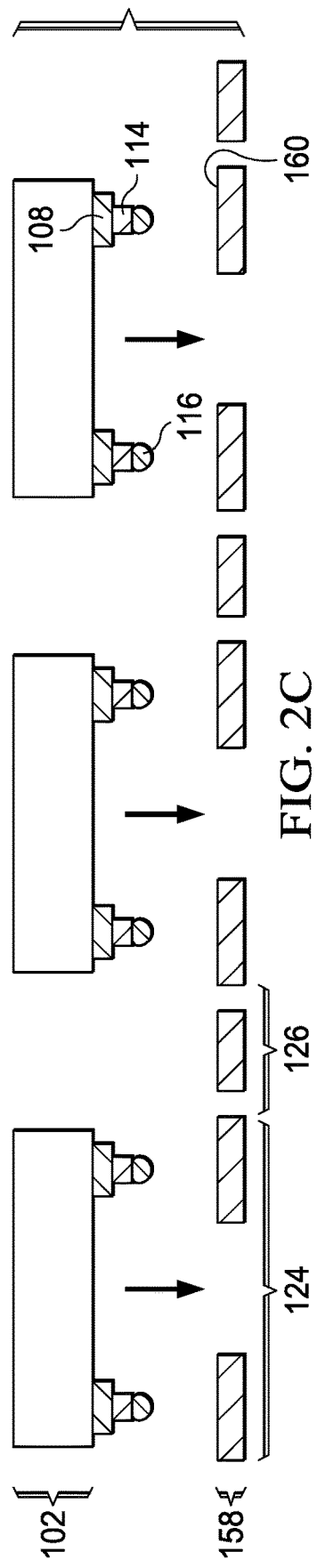

FIG. 2C shows in a cross sectional view semiconductor dies 102 after the semiconductor dies 102 have been singulated from the semiconductor wafer 101 with bond pads 108, post connects 114 and solder bumps 116. Solder bumps 116 can be shaped in a thermal reflow process of columnar plated solder to form solder bumps. Solder bumps 116 can be formed using a solder ball drop process, where solder balls are picked up using a vacuum head with an alignment pattern that corresponds to the post connects 114, the solder balls are placed on the ends of the post connects 114, and then the solder balls shaped in a thermal reflow process that bonds the solder balls to the post connects, forming solder bumps 116. The semiconductor dies 102 are flip chip oriented, with a device side surface of the semiconductor dies placed facing a die mounting surface of a package substrate 158. In the illustrated example, the package substrate 158 is a conductive lead frame. Each unit lead frame 124 in a strip or array is spaced from an adjacent unit lead frame by a saw street 126. The lead frames have a conductive surface and may include plated areas (not shown) to receive the solder bumps, or the solder bumps may be soldered directly to the lead frame surface in designated positions. Example plating layers include gold, nickel, palladium, platinum, electroless nickel, immersion gold, electroless palladium, and combinations like ENIG (electroless nickel immersion gold) and ENEPIG (electroless nickel, electroless palladium, immersion gold) that are used to improve solderability and reduce diffusion can be used at the solder joint positions.

Figure 2D:
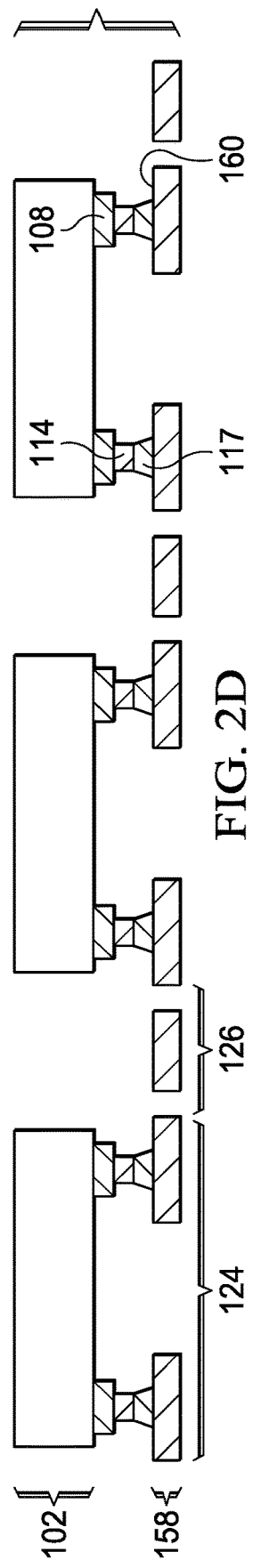

In FIG. 2D, a cross sectional view shows the singulated dies 102 after mounting on the die pads 160 on the conductive lead frame by solder joints 117 formed using solder bumps 116 (see FIG. 2C) on the conductive post connects 114. A thermal reflow process may be used to melt the solder bumps 116 and form the solder joints between the post connects 114 and the package substrate 158. The solder joints 117 provide both mechanical attachment and electrical connection between the semiconductor die 102 and the package substrate 158.

Figure 2E:
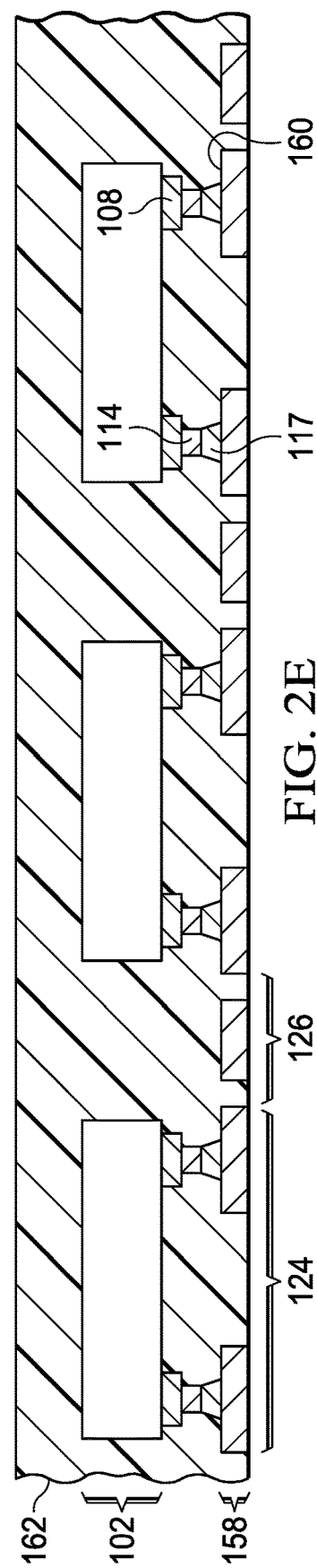

FIG. 2E is another cross sectional view that shows the semiconductor dies 102 with bond pads 108, conductive post connects 114 and solder joints 117 after an encapsulation molding process covers the semiconductor devices and portions of the package substrate 158 with a mold compound 162. The semiconductor dies 102, the solder joints 117, the conductive post connects 114, and portions of the package substrate 158 are shown covered with a mold compound 162. The mold compound 162 may be a filled resin epoxy. The mold compound 162 can be subjected to a thermal cure or can be a thermoset mold compound, heated to liquefy it, and then dispensed in a transfer mold as a heated liquid that cures and solidifies as it cools. Other mold compounds and materials such as plastics, resins, or epoxies can be used. Saw streets 126 separate the molded devices from each other between unit lead frames 124.

Figure 2F:
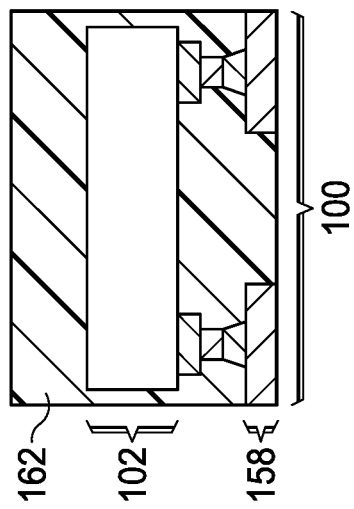
Figure 2F:
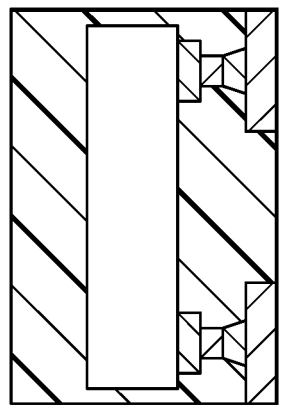
Figure 2F:
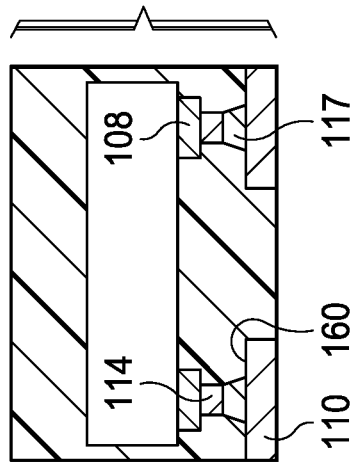

In FIG. 2F, a cross sectional view shows individual packaged semiconductor dies 100 after the devices have been singulated one from one another by cutting through the saw streets 126 on the package substrate 158. Each packaged semiconductor device 100 has a package body of mold compound 162, leads 110 that are partially covered by the mold compound 162 and with portions exposed from the mold compound 162 to form terminals for the packaged semiconductor device.

Figure 3A:
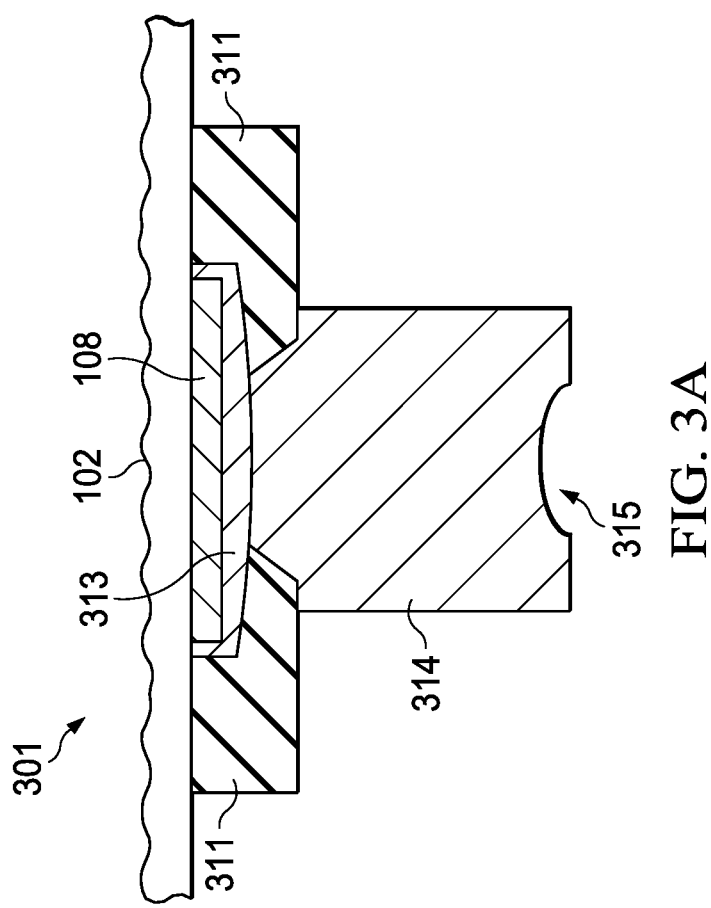
FIGS. 3A-3C illustrate in cross-sectional views details of post connects.
Figure 3B:
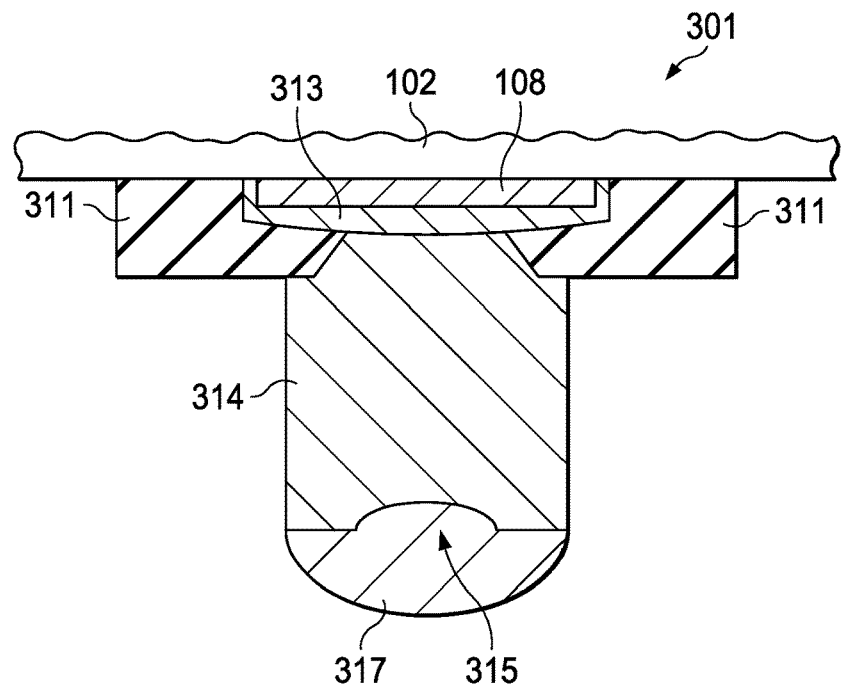

FIGS. 3A-3B illustrate, in cross-sectional views, details of some plated post connects. In FIG. 3A, semiconductor substrate 102 has a bond pad 108 on a surface. Aluminum and copper bond pads can be used, increasingly semiconductor processes use copper for metallization in manufacturing semiconductor devices and for bond pads. A process for forming a top metal layer of copper can be used, sometimes referred to as "copper over anything" or COA. Passivation dielectric materials which can be of several layers, are formed over the surface of the substrate and surrounding the bond pad 108, and partially overlying the bond pad 108. This layer 311 may be a polyimide material and is sometimes referred to as a "PI" layer. An under bump metallization (UBM) 313 is formed on the bond pad 108. UBM materials are chosen to form diffusion barriers, increase adhesion and improve the reliability of the conductive post connects, and to provide a low resistance electrical path between the bond pad 108 and the post connects. The PI layer 311 is opened in a photolithographic process to expose the surface of the bond pad and the UBM. To form the post connect 314, a plating process can be used. A seed layer for plating can be deposited by sputtering, for example, and then patterned over the UBM 313. Electroless or electroplating can be used to deposit a layer of the metal for the post connect 314 on the seed layer. The post connect can be gold, copper, or combinations or alloys of these. The post connect material will plate onto the exposed seed layer, and thus form posts, rails, or columns depending on the seed layer pattern. In an example where the post connects are copper and are round columns or are oval shapes in cross section, the post connects are sometimes referred to as "copper pillars". However, gold and other materials can be used. An inherent "dished" feature typically forms when plating the post connects due to dishing during plating, forming dished feature 315, where the center portion of the distal end of the post connects has an indentation or convex feature. This occurs because the seed layer or UBM layer is lying over the bond pad and over the PI layer 311, so that it falls into the opening in the PI layer 311 to cover the bond pad 108. The post connect 314 has a proximal end that is attached to the semiconductor substrate 102 at the bond pad 108, and a distal end that extends away from the semiconductor substrate 102, and which has the dished feature 315. The distal end of post connect 314 will be have solder formed on it, the solder will be used for mounting the semiconductor die 102 to a package substrate.

FIG. 3B illustrates in a cross sectional view the post connect 314 including a solder bump 317. In FIG. 3B, after the distal end of the post connect 314 is completed as in FIG. 3A, a solder ball drop process places a solder ball at the distal end of the post connect 314, and the solder ball is then subjected to a thermal reflow to form solder bump 317. As an alternative approach, a solder plating process can be used to form solder bump 317.

When the post connect 314 of FIG. 3B is used in a flip chip mounting operation, a solder joint is formed by another thermal process that melts the solder bump 317 onto a conductive pad on a package substrate.

Figure 3C:
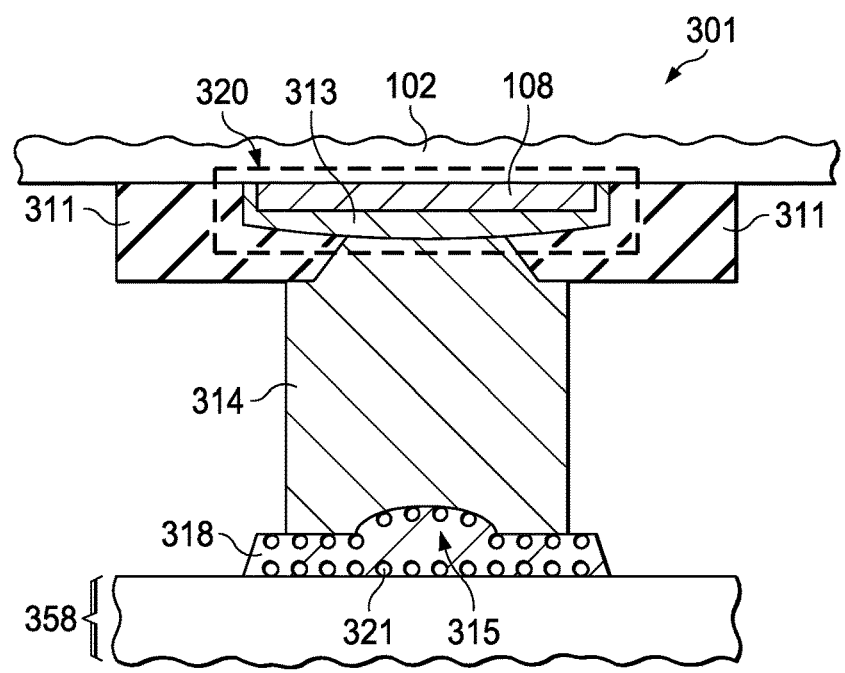

FIG. 3C illustrates the post connect 314 after the semiconductor die 102 is mounted to a package substrate 358. In FIG. 3C, the solder bump 317 of FIG. 3B is shown after a reflow process forms a solder joint 318 coupling the distal end of the post connect 314 to the package substrate 358. Voids 321 are shown formed in the solder joint 318. Because the post connect 314 has a dished feature 315, as the solder joint 318 forms, some solder is pulled away from the package substrate 358 due to solder shrinkage during thermal processing, and voids 321 can form. Solder is also converted to an intermetallic compound (IMC) at a solder to metal interface where the solder 318 meets the package substrate 358, and some solder is lost in that IMC formation process. These voids reduce the electrical performance of the solder joint, increasing the resistance, and provide a less reliable solder joint than desired.

FIG. 3C further illustrates another aspect of the post connect 314. When the post connect 314 is plated, the diameter of the post connect at the surface of the bond pad 108 (see area 320 in FIG. 3C) is less than the overall diameter of the post connect 314, because the opening for the bond pad in the PI layer 311 is less than the diameter of the post connect 314. As a result, the resistance of the post connect 314 is reduced, and electrical performance is adversely impacted by the shape of the post connect and bond pad interface.

Figure 4A:
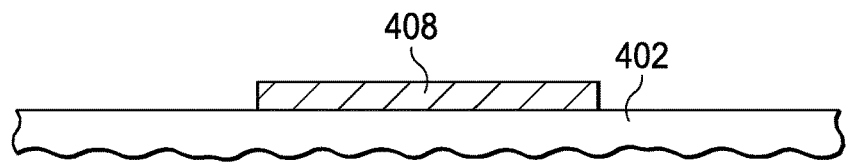
FIGS. 4A-4H illustrate, in a series of cross-sectional views, steps for making post connects of the arrangements.

FIGS. 4A-4H illustrate, in a series of cross sections, selected steps for forming an arrangement. In FIG. 4A, a bond pad 408, such as a copper over anywhere (COA) pad, is formed over a semiconductor substrate 402.

Figure 4B:
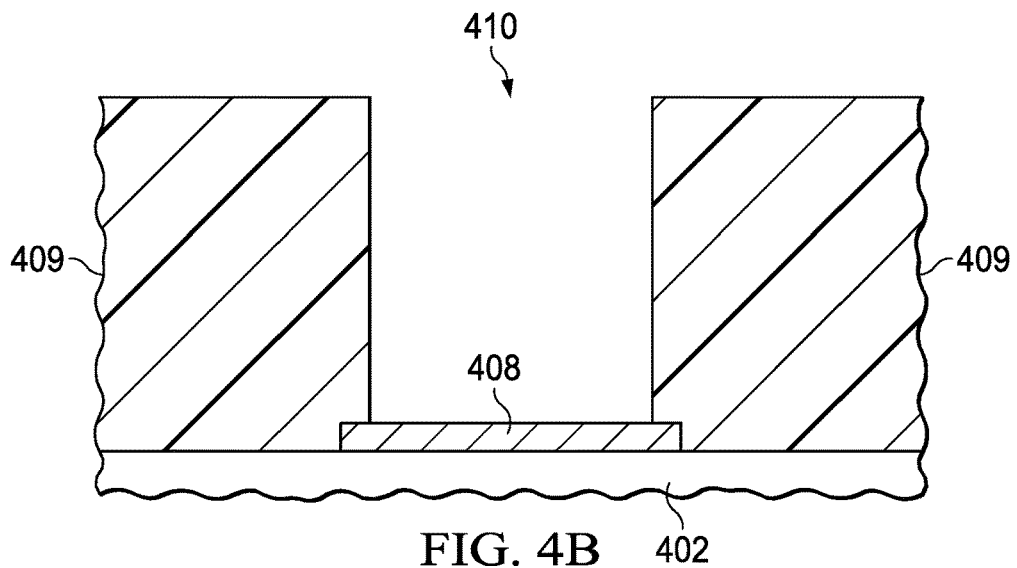

FIG. 4B illustrates the bond pad 408 and the semiconductor substrate 402 of FIG. 4A, after additional processing. In FIG. 4B, photoresist layer 409 is shown after deposition and patterning, with an opening 410 formed in photoresist layer 409 at a location for forming a post connect, over the bond pad 408.

Figure 4C:
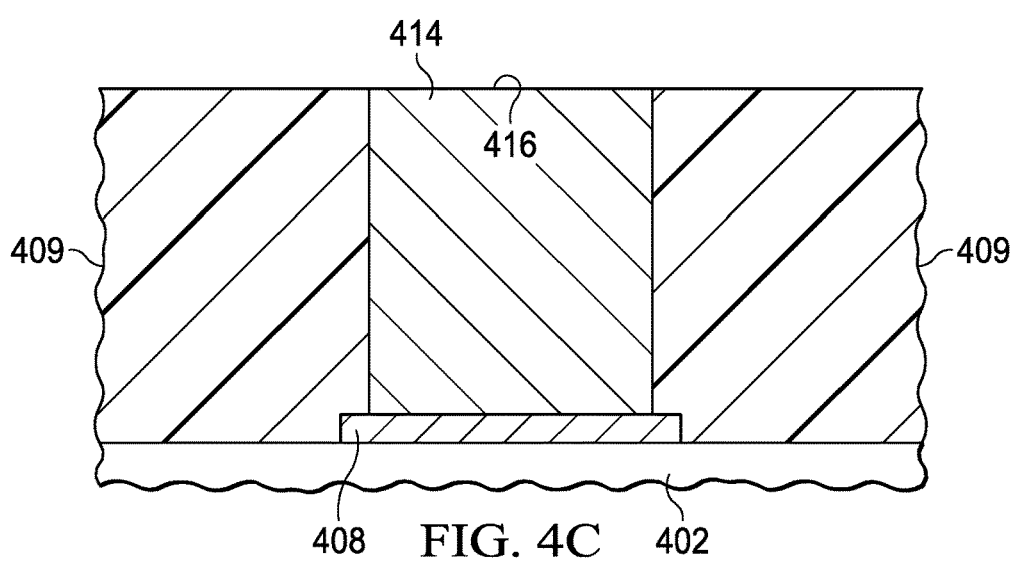

FIG. 4C illustrates, in another cross section, the semiconductor substrate 402 and bond pad 408 of FIG. 4B after additional processing. In FIG. 4C, the post connect 414 is shown formed by plating, such as electroplating or electroless plating. The post connect 414, in one example, is copper. Other conductive materials can be plated, such as gold, to form post connects. In the example of FIG. 4C, the post connect 414 has a flat distal end 416, with a proximate end formed on the bond pad 408. In an alternative arrangement, as shown below in FIG. 4FA, the distal end of the post connect 414 can be slightly convex.

Figure 4D:
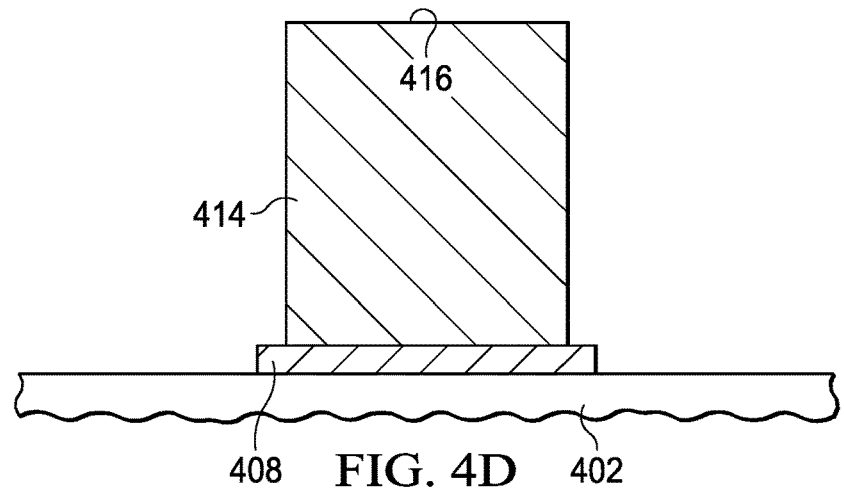

FIG. 4D illustrates the post connect 414, the bond pad 408 and the substrate 402 of FIG. 4C, after additional processing. In FIG. 4D, the photo resist layer 409 of FIG. 4C has been removed. In one example, a resist strip process is used. Additional etch and ashing processes can be used to remove photoresist from the post connect 414 and the bond pad 408. Note that post connect 414 has a uniform diameter from the distal end 416 to the bond pad 408. The surface area on the bond pad 408 that is contacted by the post connect is the same as the area for the distal end 416.

Figure 4E:
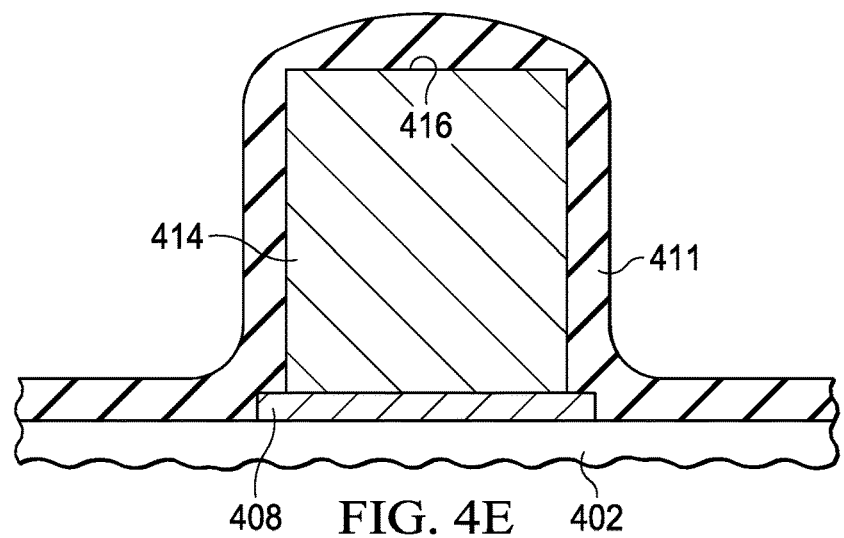

FIG. 4E illustrates the post connect 414 of FIG. 4D after additional processing. In FIG. 4E, a polyimide (PI) layer 411 is shown deposited over the post connect 414, the bond pad 408, and the substrate 402. The PI layer is conformally deposited and covers the sides and the distal end 416 of the post connect 414.

Figure 4F:
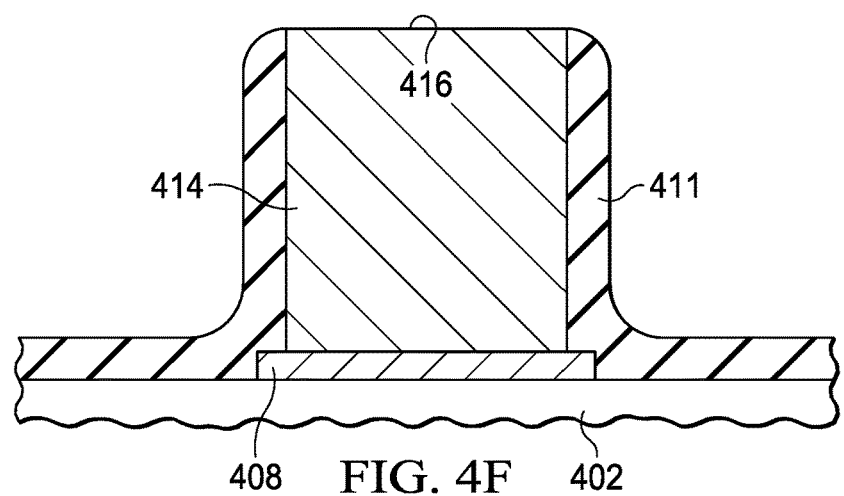
Figure 4F:
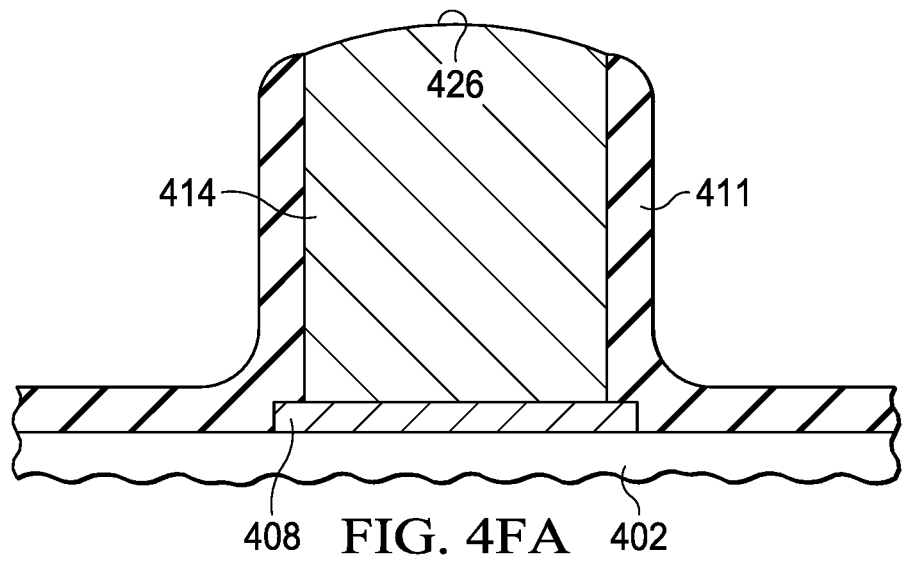

FIG. 4F illustrates the post connect 414 and the PI layer 411 of FIG. 4E after additional processing. In FIG. 4F, the PI layer 411 is shown after a pattern, cure, and ash or etch process removes the uncured PI layer from the distal end of the post connect 414. The PI layer 411 can be, in some examples, a UV cure material. Alternatives include thermal cure materials. Because the post connect 414 is plated before the PI layer 411 is formed, this process can be referred to as a "PI last" process, in contrast to post connect plating processes that form the post connects over an opening in a PI layer.

FIG. 4F shows a post connect 414 with flat distal end 416. In an alternative approach, in FIG. 4FA, the post connect 414 has a convex distal end 426, which can be formed by modifying the plating processes. PI layer 411, bond pad 408, and substrate 402 are arranged as in FIG. 4F.

Figure 4G:
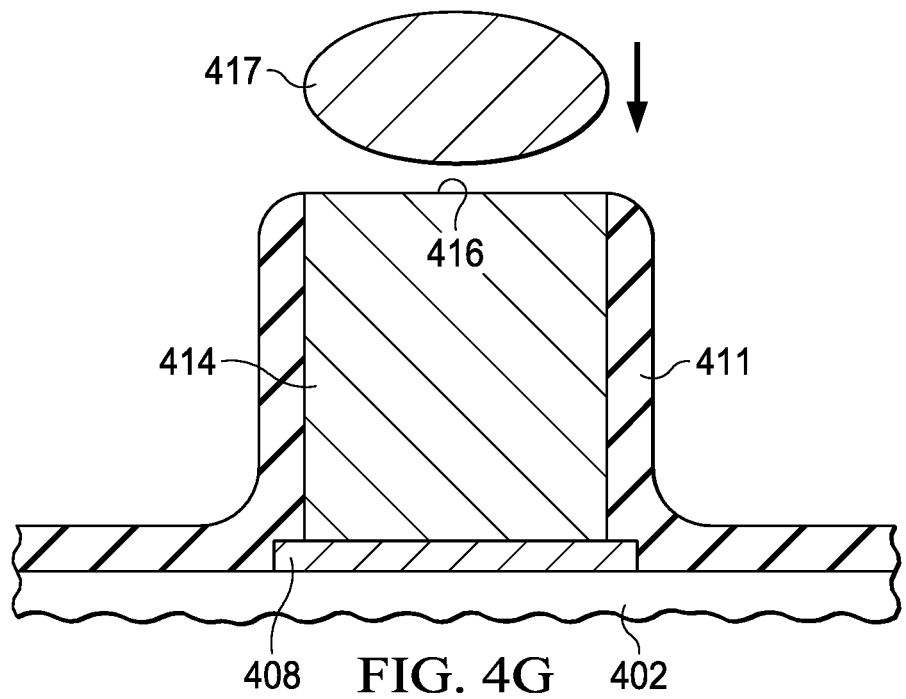

FIG. 4G illustrates the post connect 414 and PI layer 411 of FIG. 4F after additional processing. In FIG. 4G, a solder ball drop process is illustrated, with solder ball 417 being positioned on the distal end 416 of the post connect 414. The solder ball can be a lead based solder, or more likely, a lead free solder. Solder useful in the arrangements includes SnAgCu (SAC), and SnAg.

Figure 4H:
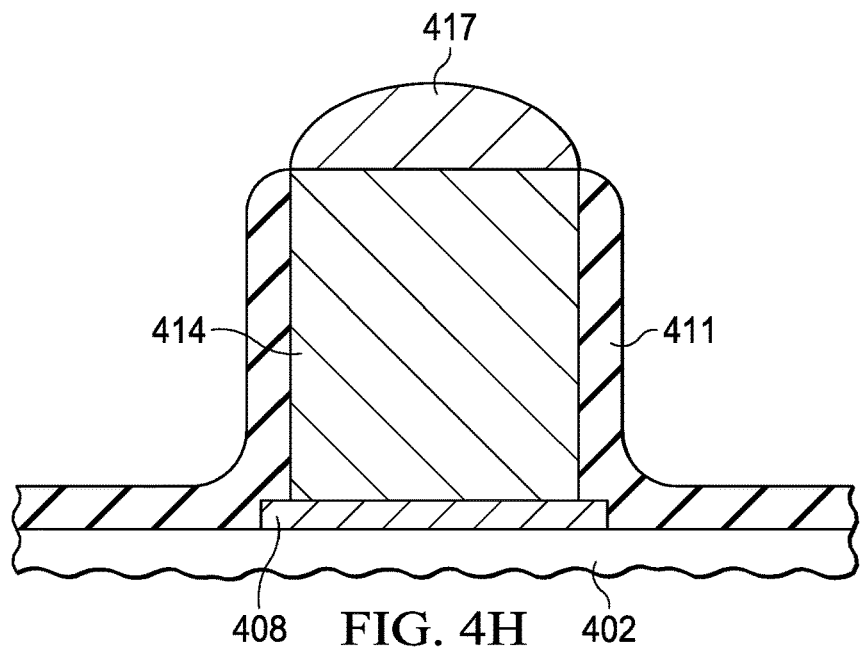

FIG. 4H illustrates the post connect 414 of FIG. 4G after additional processing. In FIG. 4H, the solder ball 417 has been attached to the distal end of post connect 414 (see 416 in FIG. 4G) by a reflow process, and shaped to form a solder bump. The post connect 414 is now completed, with PI layer 411 covering the bond pad 408 around the post connect 414, and covering the sides of the post connect 414.

Figure 5:
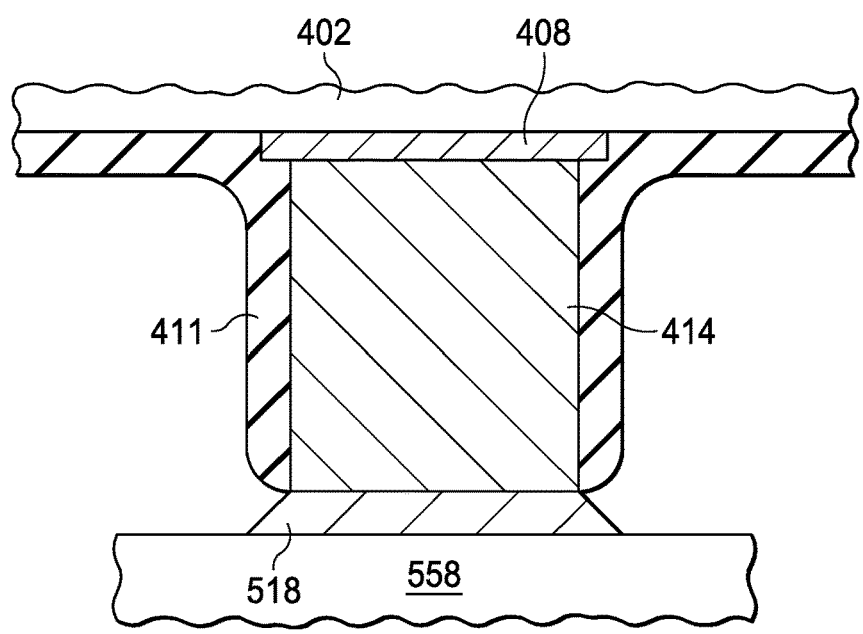
FIG. 5 illustrates, in a cross sectional view, a post connect with a solder joint in a flip chip mounted device package.

FIG. 5 illustrates, in a cross sectional view, the post connect 414 after a flip chip mounting operation. In FIG. 5, the post connect 414 is shown attached to a package substrate 558 (for example, a copper lead frame) by a solder joint 518. Other package substrates can be used, including metal lead frames such as stainless steel, steel, and alloy 42 lead frames. The solder joint 518 forms when the solder bump 417 (see FIG. 4H) is placed in contact with the package substrate 558 and melted in a thermal reflow process. The solder joint 518 forms when the solder in solder bump 417 melts and then hardens as it cools, the solder joint 518 provides both a mechanical connection and an electrical connection between the post connect 414, and the package substrate 558. The PI layer 411 covers the sides of the post connect 414, and this provides additional protection from shorts between adjacent post connects due to solder bridging. The bond pad 408 and the semiconductor substrate 402 are now flipped over (compared to the orientation of FIG. 4H) and so the semiconductor substrate 402 is flip chip mounted to the package substrate 558. As described above with respect to FIGS. 2C-2F, after a semiconductor die is flip chip mounted to a package substrate, a molding operation can form a packaged semiconductor device, with the mold compound in contact with the post connects and the semiconductor die, to provide a protective package. No lead packages such as a QFN package can be formed using the arrangements. The post connects can be formed in parallel on common traces on a package substrate, to form a rail conductor on the package substrate, the parallel post connects can reduce resistance and carry increased current, for power and ground connections to a power transistor, for example.

Use of the post connects of the arrangements results in reduced solder voids, or results in solder joints without voids. Voids are reduced because the flat or convex shaped distal ends of the post connects are less susceptible to voiding due to solder shrinkage. Unlike the dished or concave ends of post connects formed without the use of the arrangements, use of the post connects of the arrangements, with flat or convex distal ends, results in less solder shrinkage, and fewer voids. Because the full diameter of the post connect of the arrangements contacts the bond pad, the electrical performance is increased, with a 53% increase in electrical performance when compared to post connects of the same diameter formed without the use of the arrangements. In an example process, the post connects have a height of about 50 microns above the bond pads, with diameters in the range of 75-150 microns, and the post connects can be oval, round, square or columnar shapes. Diameter and height or thickness of the post connects can vary.

FIGS. 6A-6B illustrate, in flow diagrams, steps of a method for forming the post connects of the arrangements in manufacturing the semiconductor package. In FIG. 6A, the method begins at step 601 by forming bond pads or top metal layers over a semiconductor substrate (see FIG. 4A). A copper over anything (COA) process can be used, as one example process. At step 603, the method continues by depositing a layer of photoresist over the bond pads (see FIG. 4B, photoresist 409). At step 605, the layer of photoresist is patterned to form openings over the bond pads (see FIG. 4B). At step 607, the method continues by plating the post connects in the openings in the photoresist (see post connect 414, in FIG. 4C). At step 609, the method continues by removing the photoresist from the post connects (see FIG. 4D. The distal ends of the post connects will have a flat end or a convex end. The method continues at step 611, which is illustrated in FIG. 6B.

FIG. 6B illustrates the remaining steps. Coming from step 609, in FIG. 6A, step 611 is shown in FIG. 6B. At step 611, the PI layer is deposited over the post connects. This step is performed after the post connects are plated, and so the process can be referred to as a "PI last" process (see FIG. 4E, PI 411). At step 613, the PI layer is patterned, and the PI layer is cured, the pattern removes the PI layer from the distal ends of the post connects. At step 615, the uncured PI layer material is removed. The distal ends of the post connects are exposed, while the sides of the post connects remain covered by the PI layer (see FIG. 4F). At step 617, the method continues. Solder balls are dropped onto the distal ends of the post connects (see FIG. 4G, solder ball 417). At step 619, a solder reflow process attaches the solder balls to the post connects, and forms solder bumps (see FIG. 4H). At step 621, the semiconductor die can be flip chip mounted to a package substrate, such as a lead frame, and the solder bumps on the post connects can be used to make the connections between the semiconductor die and the package substrate (see FIG. 5).

Use of the arrangements provides improved post connects with reduced or eliminated solder voids in a flip chip package. The use of the arrangements does not require any new or additional materials or tools. The use of the arrangements results in fewer process steps than a post connect process performed without using the arrangements. Electrical performance of the post connects in a packaged device is improved by use of the arrangements.

Modifications are possible in the described arrangements, and other alternative arrangements are possible within the scope of the claims.

What is claimed is:

1. An apparatus, comprising:
a semiconductor die having a device side surface;
bond pads on the semiconductor die on the device side surface;
post connects having a proximate end on the bond pads and extending from the bond pads to a distal end, the diameter of the post connects including a uniform diameter from the proximate end to the distal end;
polyimide material covering sides of the post connects from the proximate end till the distal end, and covering at least a portion of the bond pads;
solder on the distal end of the post connects; and
a portion of a lead frame physically contacting the solder.

2. The apparatus of claim 1, wherein the distal end of the post connects is flat.

3. The apparatus of claim 1, wherein the distal end of the post connects is a convex shape.

4. The apparatus of claim 1, wherein the post connects comprise copper or gold.

5. The apparatus of claim 1, wherein the solder comprises lead solder, SnAg solder, or SnAgCu solder.

6. The apparatus of claim 1, wherein polyimide material covers portions of the semiconductor die.

7. A packaged semiconductor device, comprising:
a semiconductor die having bond pads on a device side surface;
post connects formed on the bond pads, the post connects having a proximate end on the bond pads and extending from the bond pads to a distal end;
polyimide material covering all sides of the post connects and at least a portion of the bond pads;
a solder joint formed between the distal ends of the post connects and a package substrate, the device side surface of the semiconductor die facing the package substrate; and
mold compound covering the semiconductor die, the post connects, and a portion of the package substrate to form a packaged semiconductor device.

8. The packaged semiconductor device of claim 7, wherein the post connects have a uniform diameter from the distal end to the proximate end.

9. The packaged semiconductor device of claim 7, wherein the distal end of the post connects is flat or convex shaped.

10. The packaged semiconductor device of claim 7, wherein the packaged semiconductor device is a quad flat no lead (QFN) packaged semiconductor device.

11. The packaged semiconductor device of claim 7, wherein polyimide material covers portions of the semiconductor die.

12. The packaged semiconductor device of claim 7, further comprising a portion of a lead frame physically contacting the solder joint.

13. The packaged semiconductor device of claim 7, wherein the solder joint comprises lead solder, SnAg solder, or SnAgCu solder.

14. An apparatus, comprising:
  a semiconductor die having a device side surface including a bond pad;
  post connect including a proximate end physically contacting the bond pad and extending from the bond pads to a distal end, the diameter of the post connects including a uniform diameter from the proximate end to the distal end;
  polyimide material contacting sides of the post connects from the proximate end till the distal end, and covering at least a portion of the bond pad and the semiconductor die;
  solder physically contacting the distal end of the post connects; and
  a portion of a lead frame physically contacting the solder.

15. The apparatus of claim 14, wherein the distal end of the post connects is flat.

16. The apparatus of claim 14, wherein the distal end of the post connects is a convex shape.

17. The packaged semiconductor device of claim 14, wherein the solder comprises lead solder, SnAg solder, or SnAgCu solder.

* * * * *